United States Patent
Huang

(10) Patent No.: US 8,729,969 B2
(45) Date of Patent: May 20, 2014

(54) OSCILLATION CIRCUIT AND OSCILLATION SYSTEM

(75) Inventor: Junwei Huang, Chengdu (CN)

(73) Assignee: IPGoal Microelectronics (Sichuan) Co., Ltd., Chengdu, Sichuan Province (CN)

( * ) Notice: Subject to any disclaimer, the term of this patent is extended or adjusted under 35 U.S.C. 154(b) by 49 days.

(21) Appl. No.: 13/494,970

(22) Filed: Jun. 12, 2012

(65) Prior Publication Data

US 2013/0154753 A1 Jun. 20, 2013

(30) Foreign Application Priority Data

Oct. 31, 2011 (CN) .......................... 2011 1 0336732

(51) Int. Cl.
*H03K 3/00* (2006.01)

(52) U.S. Cl.
USPC ............ 331/111; 331/143; 331/176; 327/291

(58) Field of Classification Search
USPC ............... 331/16, 34, 176, 111, 143; 327/291
See application file for complete search history.

(56) References Cited

U.S. PATENT DOCUMENTS 6,356,161 B1 * 3/2002 Nolan et al. .................. 331/176

* cited by examiner

*Primary Examiner* — Arnold Kinkead

(57) ABSTRACT

An oscillation circuit includes a threshold voltage extraction module, a positive temperature coefficient voltage generation module, an addition module, a common-source amplifier module, a charge and discharge module, and a clock output terminal. The common-source amplifier module includes a first field effect transistor (FET) and a second FET. The addition module includes a first operational amplifier, a second operational amplifier, a third FET, a fourth FET, a fifth FET, a sixth FET, a first resistor, a second resistor, and a third resistor. The charge and discharge module includes a seventh FET, an eighth FET, a charge and discharge FET, a first switch, a second switch, a first comparator, a second comparator, a first nor gate and a second nor gate. An oscillation system is further provided. The oscillation circuit and the oscillation system of the present invention have simple structures and are easy to implement.

10 Claims, 3 Drawing Sheets

OSCILLATION CIRCUIT AND OSCILLATION SYSTEM

BACKGROUND OF THE PRESENT INVENTION

1. Field of Invention

The present invention relates to an oscillation circuit and an oscillation system, and more particularly to an oscillation circuit capable of generating a high-precision clock and an oscillation system thereof.

2. Description of Related Arts

An oscillator is an electronic element for generating a repeating electronic signal which is usually a sine wave or a square wave. A circuit constituted by the oscillator is called an oscillation circuit. And the oscillation circuit is an electronic circuit or device capable of converting a direct current into an alternating current with a certain frequency, and outputting the alternating current.

In general process conditions, it is difficult to generate a high-precision clock via the oscillation circuit, because the characteristic of an element in the oscillation circuit varies with the process corner or the temperature, and the variation often causes an clock frequency deviation up to ±20% in the oscillation circuit. Thus, it is necessary to provide an oscillation circuit capable of generating the high-precision clock and an oscillation system thereof.

SUMMARY OF THE PRESENT INVENTION

In view of the descriptions mentioned above, it is necessary to provide an oscillation circuit capable of generating a high-precision clock and an oscillation system thereof.

An oscillation circuit, comprises a threshold voltage extraction module, a positive temperature coefficient voltage generation circuit, an addition module connected with the threshold voltage extraction module and the positive temperature coefficient voltage generation circuit, a common-source amplifier module connected with the addition module, a charge and discharge module connected with the common-source amplifier module, and a clock output module connected with the charge and discharge module, wherein the common-source amplifier module comprises a first field effect transistor (FET), and a second FET connected with the first FET, the addition module comprises a first operational amplifier connected with the threshold voltage extraction module, a second operational amplifier connected with the positive temperature coefficient voltage generation module, a third FET connected with the first operational amplifier, a fourth FET connected with the first operational amplifier, a fifth FET connected with the second operational amplifier, a sixth FET connected with the second operational amplifier, a first resistor connected with the third FET, a second resistor connected with the fifth FET, and a third resistor connected with the sixth FET, the charge and discharge module comprises a seventh FET connected with the first FET, an eighth FET connected with the second FET, a charge and discharge FET for charging and discharging, a first switch connected between the seventh FET and the charge and discharge FET, a second FET connected between the seventh FET and the eighth FET, a first comparator connected with the first switch, a second comparator connected with the first comparator, a first nor gate connected with the first comparator, and a second nor gate connected with the second comparator.

An oscillation system, comprises a threshold voltage extraction module for extracting a voltage related to a threshold voltage, a positive temperature coefficient voltage generation circuit for generating a positive voltage, an addition module connected with the threshold voltage extraction module and the positive temperature coefficient voltage generation module, a common-source amplifier module connected with the addition module for generating a current which is independent of a temperature and related to a gate oxide capacitor, a charge and discharge module connected with the common-source amplifier module for charging and discharging a charge and discharge capacitor, and a clock output module connected with the charge and discharge module, wherein the common-source amplifier module comprises a first FET, and a second FET connected with the first FET.

Compared with the prior art, the oscillation circuit and the oscillation system of the present invention are capable of generating a high-precision clock having a clock frequency independent of a temperature, a process corner and a power source, have simple structures, and are easy to implement.

These and other objectives, features, and advantages of the present invention will become apparent from the following detailed description, the accompanying drawings, and the appended claims.

DETAILED DESCRIPTION OF THE PREFERRED EMBODIMENT

Figure 1:
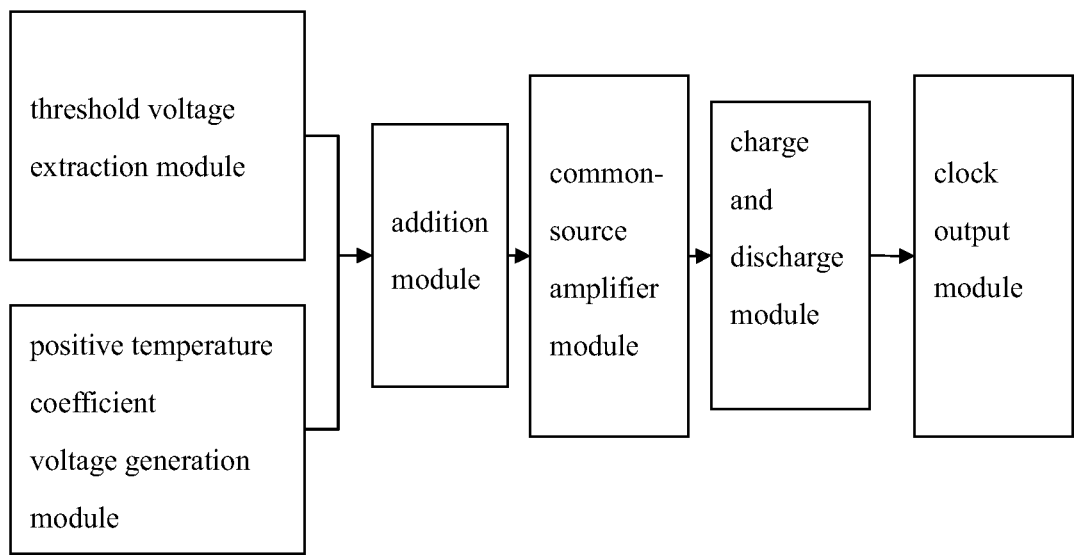
FIG. 1 is a system frame diagram of an oscillation system according to a preferred embodiment of the present invention.

Referring to FIG. 1 of the drawings, an oscillation system according to a preferred embodiment of the present invention, comprises a threshold voltage extraction module, a positive temperature coefficient voltage generation circuit, an addition module connected with the threshold voltage extraction module and the positive temperature coefficient voltage generation circuit, a common-source amplifier module connected with the addition module, a charge and discharge module connected with the common-source amplifier module, and a clock output module connected with the charge and discharge module.

The threshold voltage extraction module is for extracting a voltage VTH related to a threshold voltage; the positive temperature coefficient voltage generation circuit is for generating a positive temperature voltage VPTAT; the addition module applies a voltage which is a sum of the voltage VTH output by the threshold extraction module and the positive temperature voltage VPTAT output by the positive temperature coefficient voltage generation module to the common-source amplifier module; the common-source amplifier module is for generating a current which is independent of a temperature and related to a gate oxide capacitor; the charge and discharge module is for charging and discharging a charge and discharge capacitor; the clock output module is for outputting a clock frequency which is independent of a temperature, a process corner and a power voltage.

Figure 2:
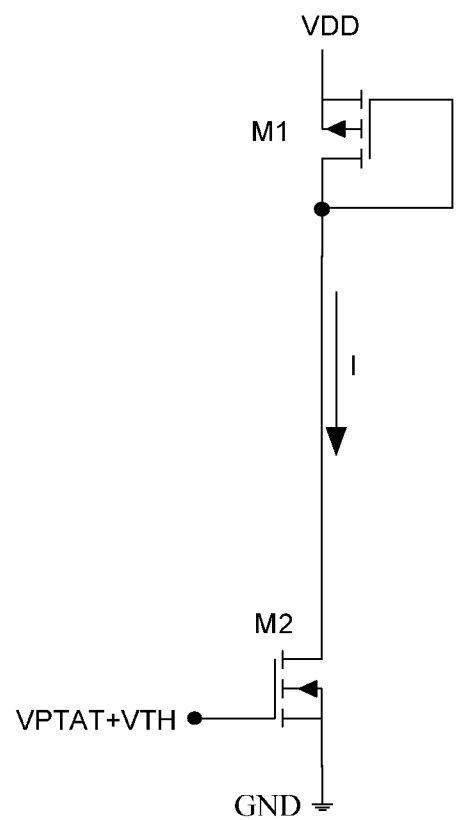
FIG. 2 is a circuit diagram of a common-source amplifier module of the oscillation system according to the preferred embodiment of the present invention.

Further referring to FIG. 2 of the drawings, which is a circuit diagram of a common-source amplifier module of the oscillation system according to the preferred embodiment of the present invention, wherein the common-source amplifier module comprises a first FET M1, and a second FET M2 connected with the first FET M1. Both a gate electrode of the first FET M1 and a drain electrode of the first FET M1 are connected with a drain electrode of the second FET M2, a source electrode of the first FET M1 is connected with a power terminal VDD, a gate electrode of the second FET M2 is for receiving a voltage which is a sum of the voltage VTH output by the addition module and the positive temperature voltage VPTAT, a source electrode of the second FET M2 is connected with a ground terminal GND.

Working principles of the oscillation system according to the preferred embodiment of the present invention are as follows.

The threshold voltage extraction module generates the voltage VTH which is related to a threshold voltage, the positive temperature coefficient generation module generates the positive temperature voltage VPTAT. A voltage VPTAT+VTH, which is a sum of the voltage VTH and the positive temperature voltage VPTAT via the addition module, is applied to the common-source amplifier module, in such a manner that the current I which is independent of the temperature and related to the gate oxide capacitor is obtained. And according to a saturation current formula of an FET, it is obtained that:

$$I=0.5*(W/L)_{M2}*COX*\mu*(Vgs(M2)-VTH)^2 \quad (1),$$

wherein $(W/L)_{M2}$ is a width to length ratio of the second FET M2; COX is a gate oxide capacitance which is related to the process corner; μ is a mobility which has a negative temperature coefficient; Vgs(M2) is a gate-source voltage of the second FET M2, Vgs(M2)=VPTAT+VTH. If the equation Vgs(M 2)=VPTAT+VTH is put into the expression (1), it is obtained that:

$$I=0.5*(W/L)_{M2}*COX*\mu*(VPTAT)^2 \quad (2).$$

In the expression (2), only the gate oxide capacitance COX is left, which is related to the process corner. And multiplying the μ which has the negative temperature coefficient thereof by a square of the positive temperature coefficient $(VPTAT)^2$, the current I independent of the temperature is obtained. Using that the current I periodically charges the charge and discharge capacitor Cmos to a first reference voltage VH, and then discharges the charge and discharge capacitor Cmos to a second reference voltage VL, the clock frequency output F is obtained, $$F=I(Cmos*(VH-VL)) \quad (3).$$

In the expression (3), both VH and VL are independent of the temperature, the process corner and the power voltage, Cmos is the charge and discharge capacitance, and has a value as follows:

$$Cmos \approx (W*L)Cmos*COX \quad (4),$$

wherein (W*L)Cmos is a size of the charge and discharge capacitor, and if the expressions (2) and (4) are put into the expression (3), the clock frequency F which is independent of the temperature, the process corner and the power voltage is obtained as follows:

$$F=0.5*(W/L)M2*\mu*(VPTAT)^2/((VH-VL)*(W*L)Cmos) \quad (5).$$

It is known from the descriptions mentioned above that the oscillation system according to the preferred embodiment of the present invention is capable of generating a high-precision clock, i.e., the clock generated is independent of the temperature, the process corner and the power source.

Figure 3:
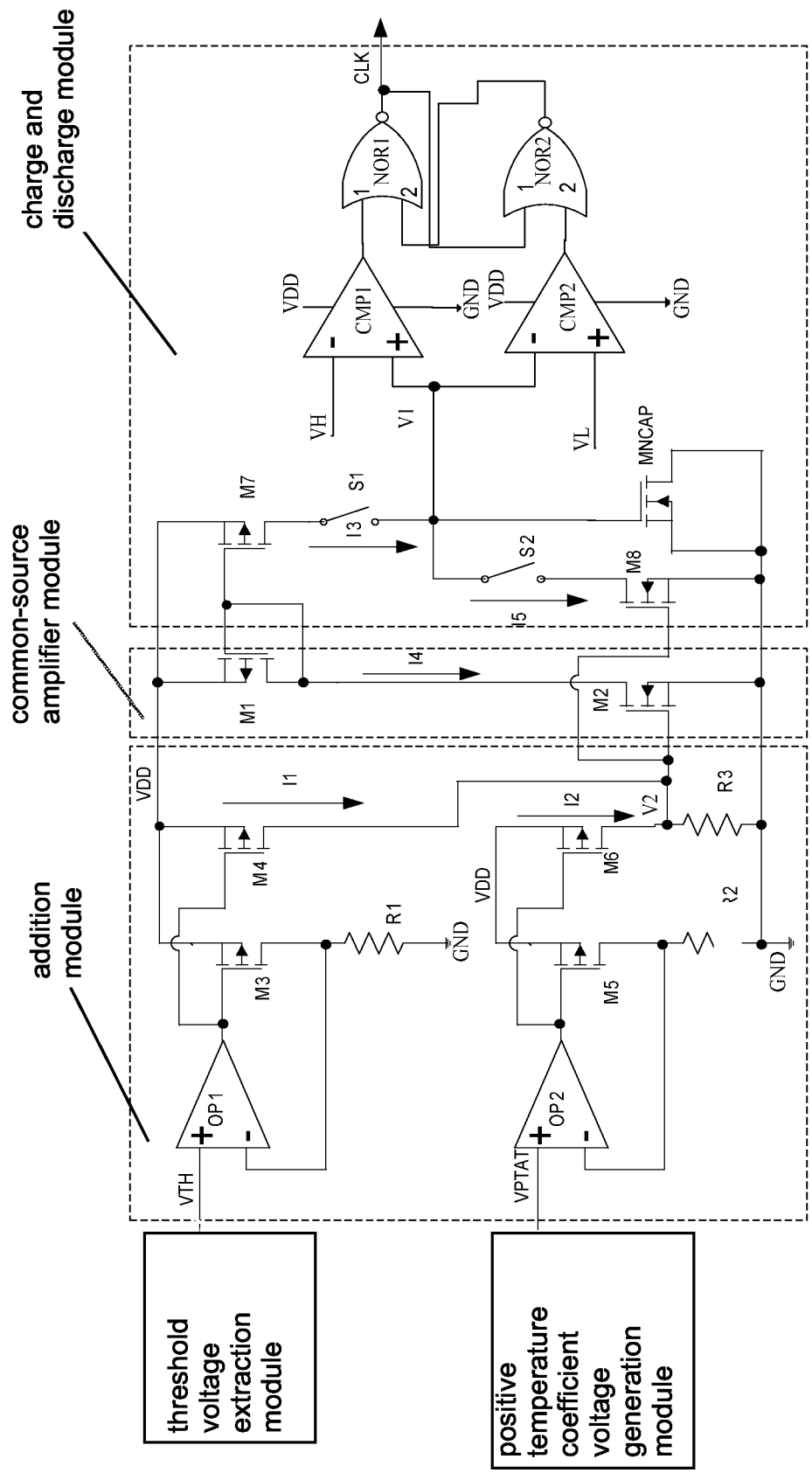
FIG. 3 is a circuit diagram of an oscillation circuit according to a preferred embodiment of the present invention.

Referring to FIG. 3 of the drawings, which is a circuit diagram of the oscillation circuit according to a preferred embodiment of the present invention is illustrated, wherein the threshold voltage extraction module is any circuit that is capable of generating a voltage VTH related to the threshold voltage; the positive temperature coefficient voltage generation module is any circuit that is capable of generating the positive temperature voltage VPTAT; the addition module comprises a first operational amplifier OP1, a second operational amplifier OP2, a third FET M3, a fourth FET M4, a fifth FET M5, and a sixth FET M6, a first resistor R1, a second resistor R2, and a third resistor R3; the common-source amplifier module comprises a first FET M1 and a second FET M2; the charge and discharge module comprises a seventh FET M7, an eighth FET M8, a charge and discharge FET MNCAP, a first switch S1, a second switch S2, a first comparator CMP1, a second comparator CMP2, a first nor gate NOR1 and a second nor gate NOR2; the clock output module is a clock output terminal CLK.

According to the preferred embodiment of the present invention, specific circuit connections of the oscillation circuit are as follows. An output terminal of the threshold voltage extraction module is connected with a positive-going input terminal of the first operational amplifier OP1, and outputs the voltage VTH which is related to the threshold voltage to the positive-going input terminal of the first operational amplifier OP1, a reversed input terminal of the first operational amplifier OP1 is connected with a drain electrode of the third FET M3 and a first terminal of the first resistor R1, an output terminal of the first operational amplifier OP1 is connected with a gate electrode of the third FET M3 and a gate electrode of the fourth FET M4. The output terminal of the positive temperature coefficient voltage generation circuit is connected with a positive-going input terminal of the second operational amplifier OP2 and inputs the positive temperature voltage VPTAT to the positive-going input terminal of the second operational amplifier OP2, a reversed input terminal of the second operational amplifier OP2 is connected with a drain electrode of the fifth FET M5, and a first terminal of the second resistor R2, an output terminal of the second operational amplifier OP2 is connected with a gate electrode of the fifth FET M5 and a gate electrode of the sixth FET M6. A drain electrode of the fourth FET M4 is connected with a drain electrode of the sixth FET M6, a first terminal of the third resistor R3, a gate electrode of the second FET M2, and a gate electrode of the eighth FET M8. A gate electrode of the first FET M1, a drain electrode of the first FET M1, and a drain electrode of the second FET M2 are all connected with a gate electrode of the seventh FET M7. A drain electrode of the seventh FET M7 is connected with a first terminal of the first switch S1; a second terminal of the first switch S1 is connected with a first terminal of the second switch S2, a gate electrode of the charge and discharge FET MNCAP, a positive-going input terminal of the first comparator CMP1, and a reversed input terminal of the second comparator CMP2. A second terminal of the second switch S2 is connected with a drain electrode of the eighth FET M8. A reversed terminal of the first comparator CMP1 is for receiving the first reference voltage VH, an output terminal of the first resistor CMP1 is connected with a first input terminal of the first nor gate NOR1. A positive-going input terminal of the second comparator CMP2 is for receiving the second reference voltage VL, an output terminal of the second comparator CMP2 is connected with a second input terminal of the second nor gate NOR2. A second input terminal of the first nor gate NOR1 is connected with an output terminal of the second nor gate NOR2, both a first input terminal of the second nor gate NOR2 and an output terminal of the first nor gate NOR1 are connected with the clock output module CLK. A source electrode of the third FET M3, a source electrode of the fourth FET M4, a source electrode of the first FET M1, a source electrode of the seventh FET M7, a source electrode of the fifth FET M5, a source electrode of the sixth FET M6, a power supply terminal of the first comparator CMP1, and a power supply terminal of the second comparator CMP2 are all connected with the power terminal VDD; a second terminal of the first resistor R1, a second terminal of the second resistor R2, a second terminal of the third resistor R3, a source electrode of the second FET M2, a source electrode of the eighth FET M8, a source electrode of the charge and discharge FET MNCAP, a drain electrode of the charge and discharge FET MNCAP, a ground terminal of the first comparator CMP1, and a ground terminal of the second comparator CMP2 are all connected with a ground terminal GND.

Working principles of the oscillation circuit according to the preferred embodiment of the present invention are as follows.

The threshold voltage extraction module extracts the voltage VTH related to the threshold voltage, the voltage VTH generates a current via the first operational amplifier OP1, the third FET M3, and the first resistor R1, and mirrors the current to a current I1, which flows through the third resistor R3, via the fourth FET M4, wherein $$I1=VTH/R1 \quad (6).$$

The positive temperature coefficient voltage generation module generates the positive temperature voltage VPTAT. The positive temperature voltage VPTAT is a difference value of a base voltage and an emitter voltage of two triodes which a same current flows through and have a different emitter area. And the positive temperature voltage VPTAT is a voltage of the positive coefficient and is independent of the process corner. The positive temperature voltage VPTAT generates a current via the second operational amplifier OP2, the fifth FET M5, and the second resistor R2, and mirrors the current to a current I2, which flows through the third resistor R3, via the sixth FET M6, wherein $$I2=VPTAT/R2 \quad (7).$$

Because both the current I1 and the current I2 flow through the resistor R3 at the same time, a voltage V2 is obtained, $$V2=R3*(VTH/R1+VPTAT/R2) \quad (8).$$

The voltage V2 applies to the common-source amplifier module which comprises the first FET M1 and the second FET M2, and generates a current I4, $$I4=0.5*(W/L)_{M2}*COX*\mu*(R3*(VTH/R1+VPTAT/R2)-VTH)^2 \quad (9).$$

If R3=R1, the expression (9) becomes as follows:

$$I4=0.5*(W/L)_{M2}*COX*\mu*(R3*VPTAT/R2)^2 \quad (10).$$

The seventh FET M7 mirrors a current that flows through the first FET M1 to obtain I4=I3, and the eighth FET M8 mirrors a current that flows through the second FET M2 to obtain I4=I5. The current I3 charges the charge and discharge FET MNCAP to a voltage V1, in such a manner that the voltage V1 equals to the first reference voltage VH, and the current I5 discharges the charge and discharge FET MNCAP from the first reference voltage VH to the voltage V1, in such a manner that the voltage equals to the second reference voltage VL. In the process mentioned above, a clock is generated by a controlling of the first comparator CMP1, the second comparator CMP2, the first nor gate NOR1, and the second nor gate NOR2. And the clock is output by the clock output terminal CLK thereof. The clock output by the clock output terminal CLK feeds back to control the first switch S1 and the second switch S2, in such a manner that charging and discharging the charge and discharge FET MNCAP is realized by controlling the current I3 and the current I5. A clock frequency output by the output terminal CLK of the clock is F:

$$F=0.5*(W/L)_{M2}*\mu*(R3*VPTAT/R2)^2/((VH-VL)*(W*L)_{MNCAP}) \quad (11).$$

In the expression (11), both the first reference voltage VH and the second voltage VL are reference voltages independent of the temperature, the process corner and the power voltage; the second resistor R2 and the third resistor R3 are resistors of the same type, and the ratios of the second resistor R2 and the third resistor R3 is a constant; $(W*L)_{MNCAP}$ is a size of the charge and discharge FET MNCAP; thus in the expression (11), all parameters related to the temperature, process corner and the power voltage are cancelled out and a temperature compensation is accomplished.

The oscillation circuit and the oscillation system of the present invention are capable of generating the high-precision clock having the clock frequency independent of the temperature, the process corner and the power source, have simple structures, and are easy to implement.

One skilled in the art will understand that the embodiment of the present invention as shown in the drawings and described above is exemplary only and not intended to be limiting.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An oscillation circuit, comprising: a threshold voltage extraction module, a positive temperature coefficient voltage generation circuit, an addition module connected with said threshold voltage extraction module and said positive temperature coefficient voltage generation circuit, a common-source amplifier module connected with said addition module, a charge and discharge module connected with said common-source amplifier module, and a clock output module connected with said charge and discharge module, wherein said common-source amplifier module comprises a first field effect transistor (FET), and a second FET connected with first FET, said addition module comprises a first operational amplifier connected with said threshold voltage extraction module, a second operational amplifier connected with said positive temperature coefficient voltage generation module, a third FET connected with said first operational amplifier, a fourth FET connected with said first operational amplifier, a fifth FET connected with said second operational amplifier, a sixth FET connected with said second operational amplifier, a first resistor connected with said third FET, a second resistor connected with said fifth FET, and a third resistor connected with said sixth FET, said charge and discharge module comprises a seventh FET connected with said first FET, an eighth FET connected with said second FET, a charge and discharge FET for charging and discharging, a first switch connected between said seventh FET and said charge and discharge FET, a second FET connected between said seventh FET and said eighth FET, a first comparator connected with said first switch, a second comparator connected with said first comparator, a first nor gate connected with said first comparator, and a second nor gate connected with said second comparator.

2. The oscillation circuit, as recited in claim 1, wherein both a gate electrode of said first FET and a drain electrode of said first FET are connected with a drain electrode of said second FET, a source electrode of said first FET is connected with a power terminal, a gate electrode of said second FET is connected with said addition module, a source electrode of said second FET is connected with a ground terminal.

3. The oscillation circuit, as recited in claim 1, wherein said threshold voltage extraction module is connected with a positive-going input terminal of said first operational amplifier, a reversed input terminal of said first operational amplifier is connected with a drain electrode of said third FET and a first terminal of said first resistor, an output terminal of said first operational amplifier is connected with a gate electrode of said third FET and a gate electrode of said fourth FET, said positive temperature coefficient voltage generation circuit is connected with a positive-going input terminal of said second operational amplifier, a reversed input terminal of said second operational amplifier is connected with a drain electrode of said fifth FET, and a first terminal of said second resistor, an output terminal of said second operational amplifier is connected with a gate electrode of said fifth FET and a gate electrode of said sixth FET.

4. The oscillation circuit, as recited in claim 3, wherein a drain electrode of said fourth FET is connected with a drain electrode of said sixth FET, a first terminal of said third resistor, a gate electrode of said second FET, and a gate electrode of said eighth FET; a gate electrode of said first FET, a drain electrode of said first FET, and a drain electrode of said second FET are all connected with a gate electrode of said seventh FET.

5. The oscillation circuit, as recited in claim 4, wherein a drain electrode of said seventh FET is connected with a first terminal of said first switch; a second terminal of said first switch is connected with a first terminal of said second switch, a gate electrode of said charge and discharge FET, a positive-going input terminal of said first comparator, and a reversed input terminal of said second comparator; a second terminal of said second switch is connected with a drain electrode of said eighth FET; a reversed terminal of said first comparator receives a first reference voltage, an output terminal of said first resistor is connected with said a first input terminal of said first nor gate.

6. The oscillation circuit, as recited in claim 5, wherein a positive-going input terminal of said second comparator receives a second reference voltage, an output terminal of said second comparator is connected with a second input terminal of said second nor gate, a second input terminal of said first nor gate is connected with an output terminal of said second nor gate, both a first input terminal of said second nor gate and an output terminal of said first nor gate are connected with said clock output module.

7. An oscillation system, comprising a threshold voltage extraction module for extracting a voltage related to a threshold voltage, a positive temperature coefficient voltage generation circuit for generating a positive voltage, an addition module connected with said threshold voltage extraction module and said positive temperature coefficient voltage generation module, a common-source amplifier module connected with said addition module for generating a current which is independent of a temperature and related to a gate oxide capacitor, a charge and discharge module connected with said common-source amplifier module for charging and discharging a charge and discharge capacitor, and a clock output module connected with said charge and discharge module, wherein said common-source amplifier module comprises a first FET, and a second FET connected with said first FET.

8. The oscillation system, as recited in claim 7, wherein both a gate electrode of said first FET and a drain electrode of said second FET are connected with a drain electrode of said second FET, a source electrode of said first FET is connected with a power terminal, a gate electrode of said second FET is for receiving a voltage output by said addition module, a source electrode of said second FET is connected with a ground terminal.

9. The oscillation system, as recited in claim 7, wherein said addition module comprises a first operational amplifier connected with said threshold voltage extraction module, a second operational amplifier connected with said positive temperature coefficient voltage generation module, a third FET connected with said first operational amplifier, a fourth FET connected with said first operational amplifier, a fifth FET connected with said second operational amplifier, a sixth FET connected with said second operational amplifier, a first resistor connected with said third FET, a second resistor connected with said fifth FET, and a third resistor connected with said sixth FET.

10. The oscillation system, as recited in claim 9, wherein said charge and discharge module comprises a seventh FET connected with said first FET, an eighth FET connected with said second FET, a charge and discharge FET for charging and discharging, a first switch connected between said seventh FET and said charge and discharge FET, a second switch connected between said seventh FET and said eighth FET, a first comparator connected with said first switch, a second comparator connected with said first comparator, a first nor gate connected with said first comparator, and a second nor gate connected with said second nor gate.

* * * * *